(12) United States Patent
Shin et al.

(10) Patent No.: US 11,887,850 B2
(45) Date of Patent: Jan. 30, 2024

(54) METHOD OF FORMING CARBON LAYER AND METHOD OF FORMING INTERCONNECT STRUCTURE

(71) Applicant: Samsung Electronics Co., Ltd., Suwon-si (KR)

(72) Inventors: Hyeonjin Shin, Suwon-si (KR); Keunwook Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 122 days.

(21) Appl. No.: 17/382,793

(22) Filed: Jul. 22, 2021

(65) Prior Publication Data

US 2022/0068633 A1  Mar. 3, 2022

(30) Foreign Application Priority Data

Aug. 31, 2020 (KR) .................. 10-2020-0110588

(51) Int. Cl.
*H01L 21/027* (2006.01)
*H01L 21/768* (2006.01)

(52) U.S. Cl.
CPC .... *H01L 21/0274* (2013.01); *H01L 21/76897* (2013.01)

(58) Field of Classification Search
CPC .......... H01L 21/0274; H01L 21/76897; H01L 21/76826; H01L 21/76883; H01L 21/02282; H01L 21/02299; H01L 21/02304; H01L 21/76849; H01L 21/02115; H01L 21/76801; H01L 21/76822; H01L 21/76877; H01L 21/0337; H01L 21/02227; H01L 21/0226; H01L 21/0332

USPC ........................................................ 438/672
See application file for complete search history.

(56) References Cited

U.S. PATENT DOCUMENTS

| | | | |
|---|---|---|---|
| 9,803,292 B2 | 10/2017 | Arnold et al. | |
| 9,941,380 B2 | 4/2018 | Liu et al. | |
| 2013/0299988 A1* | 11/2013 | Bonilla | H01L 23/53238 438/653 |
| 2015/0235959 A1* | 8/2015 | Lee | H01L 23/53252 257/750 |
| 2016/0270237 A1 | 9/2016 | Cho et al. | |
| 2018/0166333 A1 | 6/2018 | Yang et al. | |
| 2018/0218914 A1* | 8/2018 | Basu | H01L 21/76801 |

(Continued)

FOREIGN PATENT DOCUMENTS

KR  101211850 B1  12/2012
KR  2020/0015279 A  2/2020

OTHER PUBLICATIONS

Extended European Search Report dated Dec. 23, 2021, issued in corresponding European Patent Application No. 21184750.4.

*Primary Examiner* — Caleen O Sullivan
(74) *Attorney, Agent, or Firm* — Harness, Dickey & Pierce, P.L.C.

(57) ABSTRACT

Provided are a method of forming a carbon layer and a method of forming an interconnect structure. The method of forming a carbon layer includes providing a substrate including first and second material layers, forming a surface treatment layer on at least one of the first and second material layers, and selectively forming a carbon layer on one of the first material layer and the second material layer. The carbon layer has an $sp^2$ bonding structure.

25 Claims, 16 Drawing Sheets

(56) References Cited

U.S. PATENT DOCUMENTS

2020/0039827 A1 2/2020 Jung et al.
2020/0083454 A1 3/2020 Chen et al.

* cited by examiner

METHOD OF FORMING CARBON LAYER AND METHOD OF FORMING INTERCONNECT STRUCTURE

CROSS-REFERENCE TO RELATED APPLICATION

This application is based on and claims priority under 35 U.S.C. § 119 to Korean Patent Application No. 10-2020-0110588, filed on Aug. 31, 2020, in the Korean Intellectual Property Office, the disclosure of which is incorporated by reference herein in its entirety.

BACKGROUND

1. Field

The present disclosure relates to methods of forming a carbon layer and/or methods of forming an interconnect structure by using a carbon layer as a mask.

2. Description of Related Art

For high integration of semiconductor devices, the size of semiconductor devices may gradually decrease, and in accordance with this, a line width of wirings in an interconnect structure also may be reduced to a nanoscale.

To form a nano-scale wiring, a photolithography process for nano-patterning may be performed, and in this case, misalignment or overlay, or the like may occur. Recently, in order to address the above issue, a fully-aligned via (FAV) integration process may be used.

SUMMARY

Provided are methods of forming a carbon layer and/or methods of forming an interconnect structure by using a carbon layer as a mask.

Additional aspects will be set forth in part in the description which follows and, in part, will be apparent from the description, or may be learned by practice of the presented embodiments of the disclosure.

According to an embodiment, a method of forming a carbon layer may include providing a substrate including a first material layer and a second material layer; forming a surface treatment layer on at least one of the first material layer and the second material layer; and selectively forming a carbon layer on one of the first material layer and the second material layer. The carbon layer may have an $sp^2$ bonding structure.

In some embodiments, the selectively forming the carbon layer may include selectively forming the carbon layer on a hydrophobic surface of the first material layer or a hydrophobic surface of the second material layer.

In some embodiments, the carbon layer may include intrinsic graphene, nanocrystalline graphene, or graphene quantum dots (GQD).

In some embodiments, the forming the surface treatment layer may include forming the surface treatment layer as a self-assembled monolayer (SAM).

In some embodiments, after the forming the surface treatment layer, a difference between a water contact angle (WCA) of the first material layer and a WCA of the second material layer may be 50 degrees or greater.

In some embodiments, the surface treatment layer may include at least one of forming a hydrophobic surface treatment layer on one of the first material layer and the second material layer, and forming a hydrophilic surface treatment layer on an other of the first material layer and the second material layer.

In some embodiments, the hydrophobic surface treatment layer may include an organic material including a hydrophobic functional group.

In some embodiments, the hydrophilic surface treatment layer may include an organic material including a hydrophilic functional group. The hydrophilic functional group may include a functional group capable of forming a hydrogen bond.

In some embodiments, the first material layer may include a metal, and the second material layer may include an insulator or a semiconductor.

In some embodiments, the selectively forming the carbon layer may be performed using deposition, transfer, or solution coating.

In some embodiments, the method may further include selectively forming a third material layer on the first material layer or the second material layer. The third material layer may be formed on the one of the first material layer and the second material on which the carbon layer is not formed.

According to an embodiment, a method of forming an interconnect may include providing a substrate including a first metal layer and a first insulating layer; forming a surface treatment layer on at least one of the first metal layer and the first insulating layer; and selectively forming a carbon layer on the first metal layer, the carbon layer having an $sp^2$ bonding structure; selectively forming a second insulating layer on the first insulating layer; forming a third insulating layer to cover the second insulating layer; and forming a second metal layer after the forming the third insulating layer, the second metal layer being electrically connected to the first metal layer.

In some embodiments, the carbon layer may include intrinsic graphene, nanocrystalline graphene, or GQDs.

In some embodiments, the first insulating layer may include a dielectric material having a dielectric constant of 3.6 or lower.

In some embodiments, the carbon layer may have a contact angle of about 60 degrees to about 110 degrees.

In some embodiments, the carbon layer may further include F, CL, Br, N, P or O atoms.

In some embodiments, the second insulating layer may include $Al_2O_3$, AlN, $ZrO_2$, $HfO_x$, $SiO_2$, SiCO, SiON, SiCN, SiCOH, AlSiO or BN (Boron Nitride).

In some embodiments, at least a portion of the carbon layer may remain on the first metal layer after the forming the second metal layer.

In some embodiments, the method may further include removing a portion of the carbon layer or all of the carbon layer.

According to an embodiment, a method of forming a carbon layer may include forming a surface treatment layer on a substrate including a first material layer and a second material layer, and selectively forming a carbon layer on the first material layer and not the second material layer. A material of the first material layer may be different than a material of the second material layer. The surface treatment layer may be formed on the first material layer. The carbon layer may have an $sp^2$ bonding structure.

In some embodiments, the carbon layer may include intrinsic graphene, nanocrystalline graphene, or graphene quantum dots (GQDs).

In some embodiments, the forming the surface treatment layer may include at least one of forming a hydrophobic surface treatment layer on the first material layer; and forming a hydrophilic surface treatment layer on the second material layer.

In some embodiments, the first material layer may include a metal, and the second material layer may include an insulator or a semiconductor.

In some embodiments, the first material layer may include an insulator or a semiconductor, and the second material layer may include a metal.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
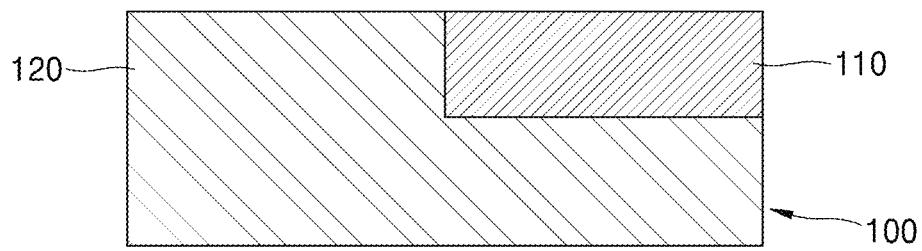
FIGS. 1 through 3 and 5 through 6 are diagrams for describing a method of forming a carbon layer, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, "may be construed as covering any one of the following combinations: A; B; A and B; A and C; B and C; and A, B, and C."

Embodiments will now be described more fully with reference to the accompanying drawings, in which embodiments of the present disclosure are shown. In the drawings, like reference numerals denote like elements, and sizes of the elements in the drawings may be exaggerated for clarity and convenience of description. Embodiments described herein are examples only, and may include various modifications.

Throughout the specification, it will also be understood that when an element is referred to as being "on" another element, it can be directly on, under, on the left of, or on the right of the other element, or intervening elements may also be present. An expression used in the singular encompasses the expression of the plural, unless it has a clearly different meaning in the context. It is to be understood that the terms such as "including", etc., are intended to indicate the existence of the components, and are not intended to preclude the possibility that one or more other components may added.

The use of the terms "the" and similar referents in the context are to be construed to cover both the singular and the plural.

The steps of all methods described herein can be performed in any suitable order unless otherwise indicated herein or otherwise clearly contradicted by context.

The use of any and all examples, or example language (e.g., "such as") provided herein, is intended merely to better illuminate features of inventive concepts and does not pose a limitation on the scope of inventive concepts unless otherwise claimed.

FIGS. 1 through 3 and 5 through 6 are diagrams for describing a method of forming a carbon layer, according to an embodiment.

Referring to FIG. 1, a substrate 100 is provided. The substrate 100 may include first and second material layers 110 and 120 having different characteristics and/or different materials. The first material layer 110 may include, for example, a metal. The metal may include, for example, at least one of Cu, Ru, Rh, Ir, Mo, W, Pd, Pt, Co, Ta, Ti, Ni, and Pd, but is not limited thereto.

The second material layer 120 may include, for example, an insulator or a semiconductor. The insulator may include, for example, silicon oxide, silicon nitride, SiOC, or boron nitride (BN), but is not limited thereto. Also, the insulator may include a porous material. The semiconductor may include, for example, at least one of a Group IV material, a Group III-V compound, and a Group II-VI compound, but is not limited thereto.

Figure 2:
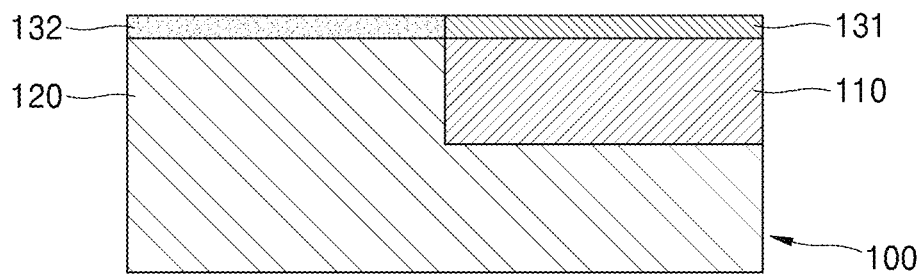

Referring to FIG. 2, surface treatment layers 131 and 132 are formed on a surface of the substrate 100. The surface treatment layers 131 and 132 may be used to adjust surface energy of the substrate 100 to allow a carbon layer 140, which will be described later, to be selectively formed only on a hydrophobic surface of the substrate 100.

The surface treatment layers 131 and 132 may include a hydrophobic surface treatment layer 131 formed on a surface of the first material layer 110 and a hydrophilic surface treatment layer 132 formed on a surface of the second material layer 120.

The hydrophobic surface treatment layer 131 may be formed as a self-assembled monolayer (SAM) on a surface of the first material layer 110. The hydrophobic surface treatment layer 131 may have a relatively small thickness of about several nm, but is not limited thereto.

The hydrophobic surface treatment layer 131 may include an organic material including a hydrophobic functional group. The hydrophobic functional group may include, for example, a fluorine group, a methyl group, or a fluorinated alkyl group. However, the above is merely an example.

The hydrophilic surface treatment layer 132 may be formed as an SAM on a surface of the second material layer 120. The hydrophilic surface treatment layer 132 may have a relatively small thickness of about several nm, but is not limited thereto.

The hydrophilic surface treatment layer 132 may include an organic material including a hydrophilic functional group. The hydrophilic functional group may include a functional group capable of forming a hydrogen bond. For example, the hydrophilic functional group may include a hydroxyl group, a thiol group, or an amino group, but these are merely examples.

As described above, as the hydrophobic surface treatment layer 131 is formed on the first material layer 110 and the hydrophilic surface treatment layer 132 is formed on the second material layer 120, a difference in surface energy between the first material layer 110 and the second material layer 120 may increase.

As the hydrophobic surface treatment layer 131 is formed on the first material layer 110 and the hydrophilic surface treatment layer 132 is formed on the second material layer 120, difference in contact angles between the first material layer 110 and the second material layer 120 may be, for example, about 50 degrees or greater, but is not limited thereto. Here, a contact angle refers to a water contact angle (WCA), which applies the same below. A WCA refers to an angle in contact with water drops on an air-liquid-solid interface.

Figure 3:
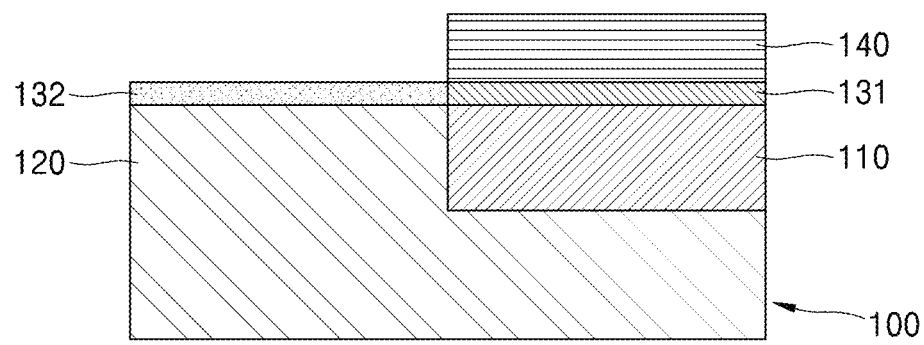

Referring to FIG. 3, the carbon layer 140 is formed on the first material layer 110, on which the hydrophobic surface treatment layer 131 is formed. The carbon layer 140 includes carbon atoms having an $sp^2$ bonding structure. The carbon layer 140 having an $sp^2$ bonding structure is hydrophobic. Accordingly, the carbon layer 140 having an $sp^2$ bonding structure may be selectively formed only on the first material layer 110, on which the hydrophobic surface treatment layer 131 is formed, in the substrate 100.

The carbon layer 140 having an $sp^2$ bonding structure may include, for example, graphene or graphene quantum dots (GQD). Graphene refers to a material having a hexagonal honeycomb structure in which carbon atoms are connected two-dimensionally. Graphene may include intrinsic graphene or nanocrystalline graphene. GQD refer to nano-sized graphene fragments. Each graphene fragment may have a disc shape having a thickness of about several nm or less (e.g., about 0.34 nm to about 100 nm, and/or about 0.34 nm to about 50 nm, and/or about 0.34 nm to about 10 nm) and a diameter of about several to tens of nm (e.g., about 100 nm or less, about 70 nm or less, or about 30 nm or less), but is not limited thereto.

Intrinsic graphene is also referred to as crystalline graphene and may include crystals having a size greater than about 100 nm. Nanocrystalline graphene may include smaller crystals in size than intrinsic graphene, for example, crystals having a size of, for example, about 100 nm or smaller.

Hereinafter, intrinsic graphene, nanocrystalline graphene, and an amorphous carbon layer will be compared in detail.

Figure 4A:
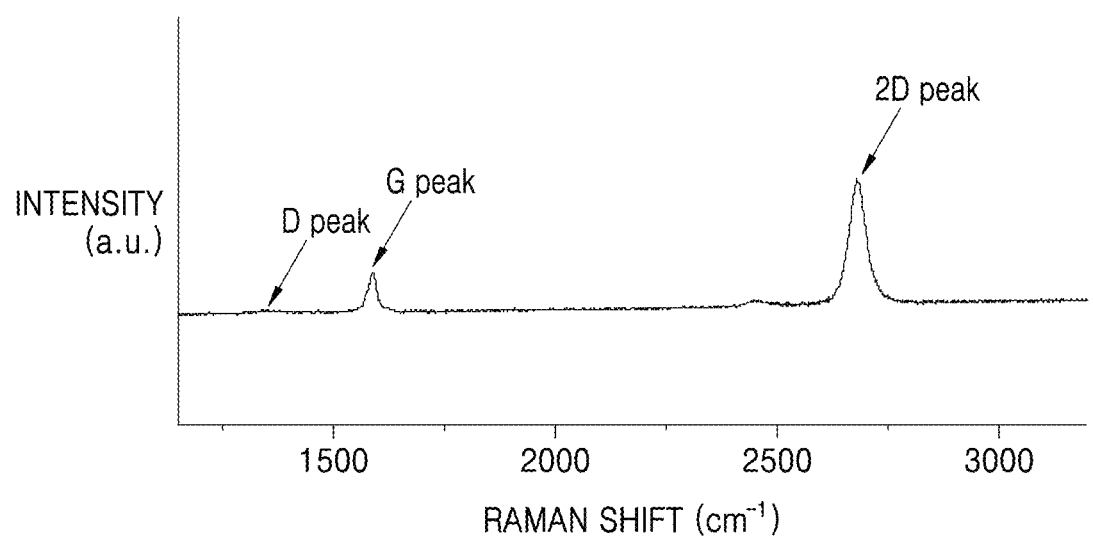
FIGS. 4A through 4C are example diagrams of Raman spectrums of intrinsic graphene, nanocrystalline graphene, and an amorphous carbon layer.
Figure 4B:
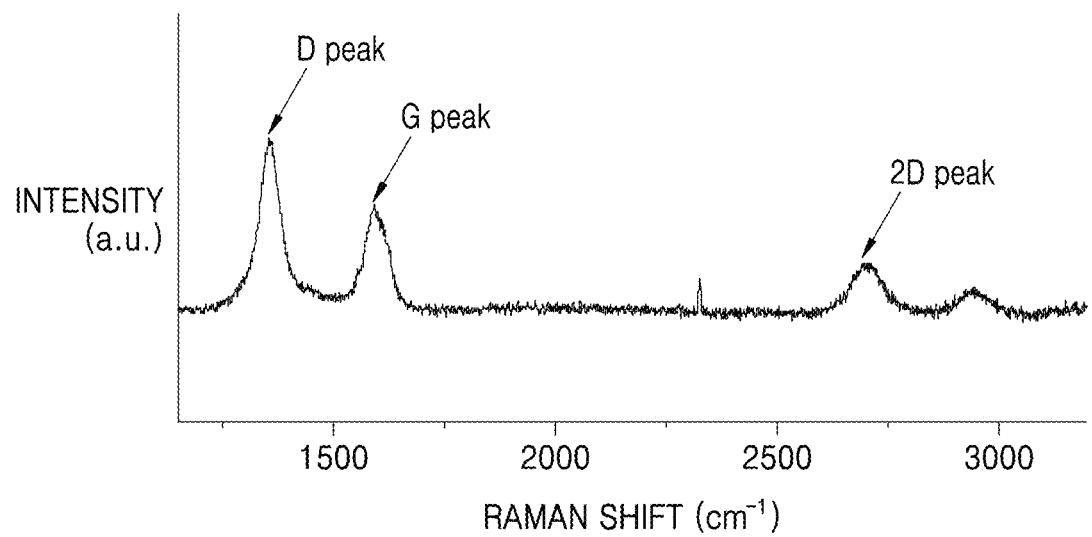
Figure 4C:
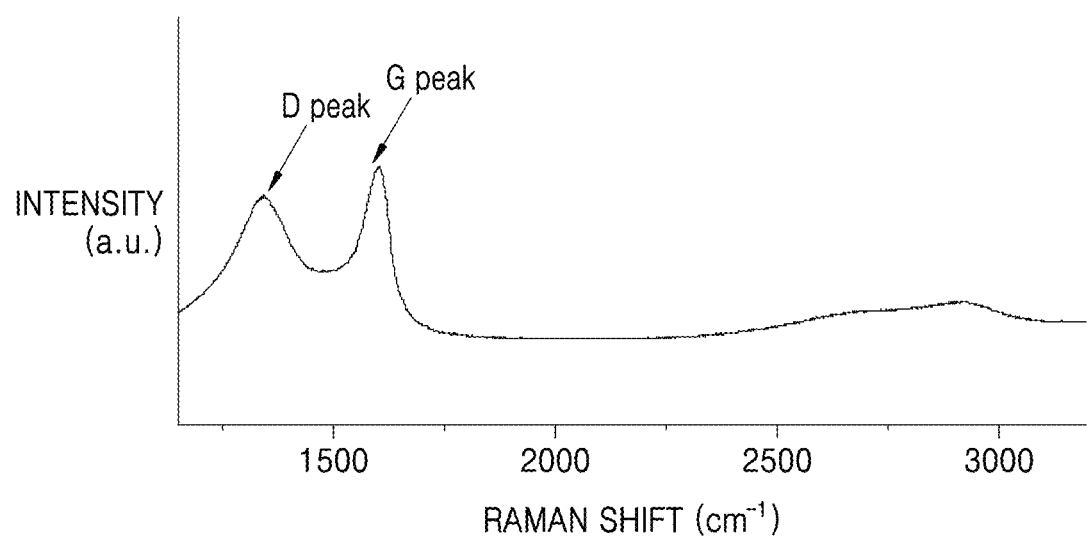

FIGS. 4A through 4C are example diagrams of Raman spectrums of intrinsic graphene, nanocrystalline graphene, and an amorphous carbon layer. A ratio of carbons having an $sp^2$ bonding structure to all the carbons to be described later may be obtained using, for example, an X-ray photoelectron spectroscopy (XPS) analysis, and a content of hydrogen may be obtained through Rutherford Backscattering Spectroscopy (RBS).

FIG. 4A is an example diagram of a Raman spectrum showing intrinsic graphene.

Referring to FIG. 4A, in intrinsic graphene, which is crystalline graphene, a ratio of D peak intensity to G peak intensity may be, for example, less than about 0.1, and a ratio of 2D peak intensity to G peak intensity may be, for example, greater than about 2. The intrinsic graphene may include crystals having a size greater than about 100 nm.

In intrinsic graphene, a ratio of carbons having an $sp^2$ bonding structure to all the carbons may be nearly 100%. Also, intrinsic graphene may hardly include hydrogen. In addition, a density of intrinsic graphene may be, for example, about 2.1 g/cc, and a sheet resistance of intrinsic graphene may be, for example, about 100 Ohm/sq to about 1000 Ohm/sq, but is not limited thereto.

FIG. 4B is an example diagram of a Raman spectrum showing nanocrystalline graphene.

Referring to FIG. 4B, in nanocrystalline graphene, a ratio of a D-peak-intensity to a G-peak-intensity may be, for example, less than about 2.1, and a ratio of 2D-peak-intensity to the G-peak-intensity may be, for example, greater than about 0.1. Also, a full width at half maximum (FWHM) of a D peak may be, for example, about 25 cm$^{-1}$ to 120 cm$^{-1}$.

Nanocrystalline graphene may include crystals having a smaller size than those of intrinsic graphene, for example, crystals having a size of about 0.5 nm to about 100 nm. In nanocrystalline graphene, a ratio of carbons having an $sp^2$ bonding structure to all the carbons may be, for example, about 50% to about 99%. Also, nanocrystalline graphene may include hydrogen in, for example, about 1 at % to about 20 at %. In addition, a density of nanocrystalline graphene may be, for example, about 1.6 g/cc to about 2.1 g/cc, and a sheet resistance of nanocrystalline graphene may be, for example, about 1000 Ohm/sq.

FIG. 4C is an example diagram of a Raman spectrum showing an amorphous carbon layer.

Referring to FIG. 4C, an FWHM of an amorphous carbon layer at a D-peak may be, for example, greater than about 120 cm$^{-1}$. In an amorphous carbon layer, a ratio of carbons having an $sp^2$ bonding structure to all the carbons may be, for example, about 30% to about 50%. Also, an amorphous carbon layer may include hydrogen of a content greater than about 20 atomic percent (at %).

Referring back to FIG. 3, the carbon layer 140 having an $sp^2$ bonding structure may be selectively formed on the first material layer 110, on which a hydrophobic surface treatment layer 131 is formed, by using deposition, transfer, or solution coating.

For example, when the carbon layer 140 includes graphene, the carbon layer 140 may be formed by depositing a graphene layer on the first material layer 110, on which the hydrophobic surface treatment layer 131 is formed, by chemical vapor deposition (CVD) or plasma enhanced CVD (PECVD). Also, the carbon layer 140 may be formed by transferring graphene to the first material layer 110, on which the hydrophobic surface treatment layer 131 is formed.

When the carbon layer 140 includes GQDs, the carbon layer 140 may be formed by coating the first material layer 110, on which the hydrophobic surface treatment layer 131 is formed, with a solution including GQDs, and drying the same.

The carbon layer 140 having an $sp^2$ bonding structure may have a contact angle greater than those of the first and second material layers 110 and 120, and accordingly, the carbon layer 140 having an $sp^2$ bonding structure may have lower surface energy than the first and second material layers 110 and 120. For example, a surface of the carbon layer 140 having an $sp^2$ bonding structure may have a relatively large contact angle of about 60 degrees to about 110 degrees, but is not limited thereto.

Figure 5:
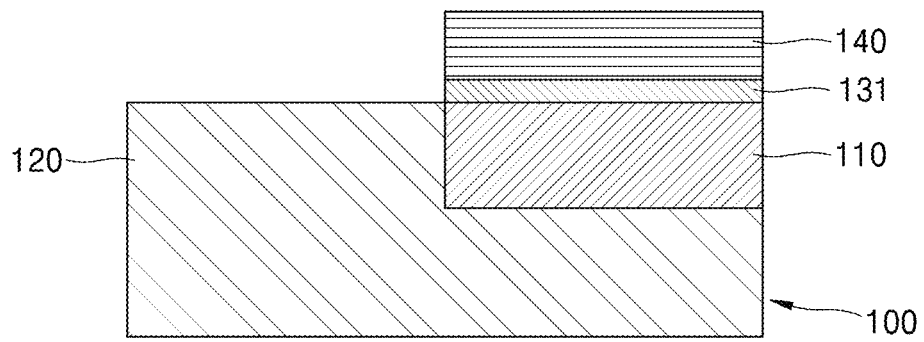

Referring to FIGS. 3 and 5, the hydrophilic surface treatment layer 132 formed on the second material layer 120 may be removed after the carbon layer 140 having an $sp^2$ bonding structure is selectively formed on the first material layer 110, on which the hydrophobic surface treatment layer 131 is formed. The hydrophilic surface treatment layer 132 may be removed using a certain annealing process. In this process, at least a portion of the hydrophobic surface treatment layer 131 formed between the first material layer 110 and the carbon layer 140 may be degraded.

Figure 6:
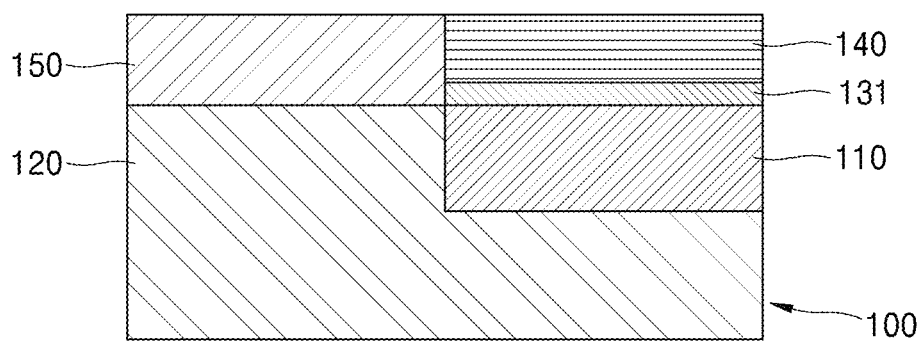

Referring to FIG. 6, a third material layer 150 may be selectively formed on the second material layer 120 after removing hydrophilic surface treatment layer 132. The carbon layer 140 having an $sp^2$ bonding structure has lower surface energy than the second material layer 120, and thus, the carbon layer 140 may act as a mask when forming the third material layer 150. Accordingly, the third material layer 150 may be selectively formed only on a surface of the second material layer 120. The third material layer 150 may include, for example, an insulator. Examples of the insulator may include $Al_2O_3$, AlN, $ZrO_2$, $HfO_x$, $SiO_2$, SiCO, SiCN, SiON, SiCOH, AlSiO, and BN, but are not limited thereto.

Above, as a method to increase a difference in surface energy between the first material layer 110 and the second material layer 120, forming the hydrophobic surface treatment layer 131 and the hydrophilic surface treatment layer 132 respectively on the first and second material layers 110 and 120 has been described. However, as a method to increase a difference in surface energy between the first material layer 110 and the second material layer 120, alternatively, the hydrophobic surface treatment layer 131 may be formed only on the first material layer 110 and no surface treatment layer may be formed on the second material layer 120 or the hydrophilic surface treatment layer 132 may be formed only on the second material layer 120 and no surface treatment layer may be formed on the first material layer 110.

When the hydrophobic surface treatment layer 131 is formed only on the first material layer 110, a difference in contact angles between a surface of the first material layer 110, on which the hydrophobic surface treatment layer 131 is formed, and a surface of the second material layer 120 where no surface treatment layer is formed may be about 50 degrees or greater. Also, when the hydrophilic surface treatment layer 132 is formed only on the second material layer 120, a difference in contact angles between a surface of the first material layer 110, on which no surface treatment layer is formed, and a surface of the second material layer 120, on which the hydrophilic surface treatment layer 132 is formed, may be about 50 degrees or greater.

Figure 7:
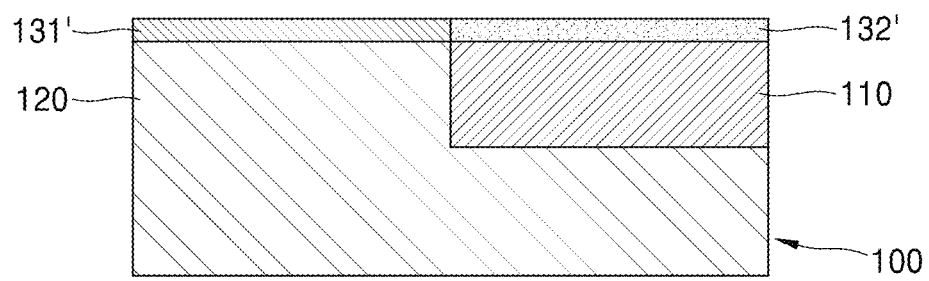
FIGS. 7 and 8 are diagrams for describing a method of forming a carbon layer, according to another embodiment.
Figure 8:
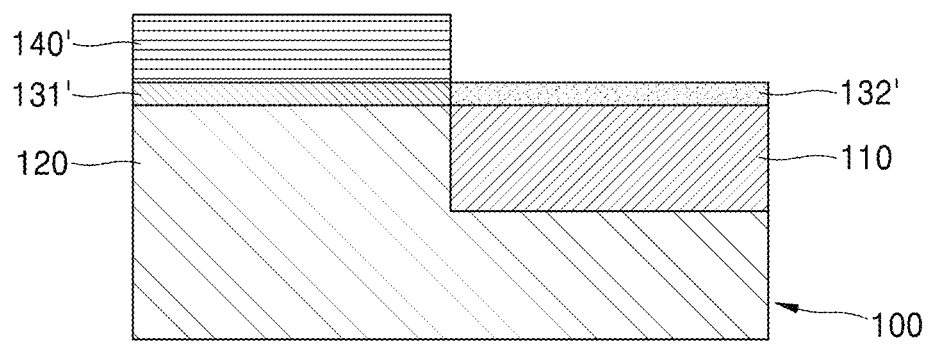

FIGS. 7 and 8 are diagrams for describing a method of forming a carbon layer, according to another embodiment.

Referring to FIG. 7, a hydrophilic surface treatment layer 132' is formed on the first material layer 110 of the substrate 100, and a hydrophobic surface treatment layer 131' is formed on the second material layer 120 of the substrate 100. The first and second material layers 110 and 120 are described above. Unlike the above-described embodiment, in the present embodiment, the hydrophilic surface treatment layer 132' is formed on the first material layer 110, and the hydrophobic surface treatment layer 131' is formed on the second material layer 120. The hydrophobic surface treatment layer 131' and the hydrophilic surface treatment layer 132' are described above, and thus, description thereof will be omitted.

Referring to FIG. 8, a carbon layer 140' having an $sp^2$ bonding structure is formed on the second material layer 120, on which the hydrophobic surface treatment layer 131' is formed. The carbon layer 140' may include, for example, graphene or GQDs. The carbon layer 140' has low surface energy, and thus, may be selectively formed only on the second material layer 120, on which the hydrophobic surface treatment layer 131' is formed, in the substrate 100. The carbon layer 140' may be formed by deposition, transfer or solution coating.

According to the embodiments above, when the substrate 100 includes the first and second material layers 110 and 120 having different characteristics, the hydrophobic surface treatment layer 131 or 131' is formed on one of the first and second material layers 110 and 120, and the hydrophilic surface treatment layer 132 or 132' is formed on the other, thereby increasing a difference in surface energy between the first material layer 110 and the second material layer 120. Accordingly, the carbon layer 140 or 140' having an $sp^2$ bonding structure having low surface energy may be selectively formed only on one of the first and second material layers 110 and 120, on which the hydrophobic surface treatment layer 131 or 131' is formed.

Hereinafter, a method of forming an interconnect structure by using the carbon layer having an $sp^2$ bonding structure, as a mask, will be described.

FIGS. 9 through 22 are diagrams for describing a method of forming an interconnect structure, according to an embodiment. In FIGS. 9 through 22, a method of forming an interconnect structure by using a fully-aligned via (FAV) integration process is illustrated.

Figure 9:
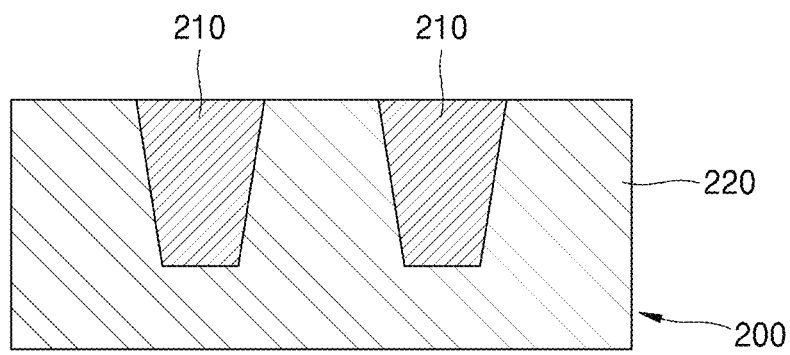
FIGS. 9 through 22 are diagrams for describing a method of forming an interconnect structure, according to an embodiment.

Referring to FIG. 9, a substrate 200 is provided. The substrate 200 may include a first insulating layer 220 and at least one first metal layer 210. In FIG. 9, an example in which two first metal layers 210 are apart from each other in the first insulating layer 220 is illustrated.

The first insulating layer 220 may typically include a low-k dielectric material as an inter-metal dielectric (IMD). In detail, for example, the first insulating layer 220 may include a dielectric material having a dielectric constant of about 3.6 or lower.

The first metal layers 210 provided in the first insulating layer 220 may be conductive wirings. The first metal layers 210 may have, for example, a nano-scale line width, but are not limited thereto. The first metal layers 210 may include, for example at least one of Cu, Ru, Rh, Ir, Mo, W, Pd, Pt, Co, Ta, Ti, Ni, and Pd, but is not limited thereto.

Figure 10:
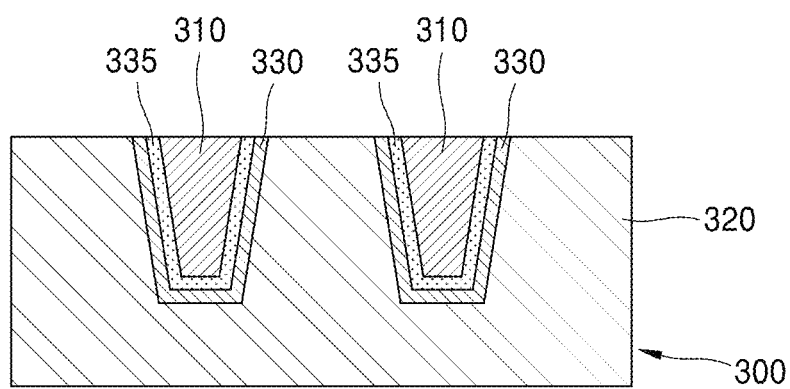

In FIG. 10, a substrate 300 according to another example is illustrated. Referring to FIG. 10, at least one first metal layer 310 is provided in a first insulating layer 320, and a barrier layer 330 is between the first metal layer 310 and the first insulating layer 320. The first insulating layer 320 and the first metal layer 310 are described above and may have different materials, and thus, description thereof will be omitted.

The barrier layer 330 may limit and/or prevent diffusion of a material of the first metal layer 310. The barrier layer 330 may have a single-layer structure or a multi-layer structure in which multiple layers including different materials from each other are stacked. The barrier layer 330 may include, for example, a metal, a metal alloy, or a metal nitride. In detail, for example, the barrier layer 330 may include Ta, Ti, Ru, RuTa, IrTa, W, TaN, TiN, RuN, IrTaN, TiSiN, Co, Mn, MnO or WN, but is not limited thereto. For example, the barrier layer 330 may include nanocrystalline graphene.

A liner layer 335 for improving adhesion between the first metal layer 310 and the barrier layer 330 may be further provided between the first metal layer 310 and the barrier layer 330. In some embodiments, the liner layer 335 may include a titanium nitride (TiN), titanium tungsten (TiW), tungsten nitride (WN), tantalum nitride (TaN), Ti, Ta, or a combination thereof. The barrier layer 330 and liner layer 335 may be different materials.

Figure 11:
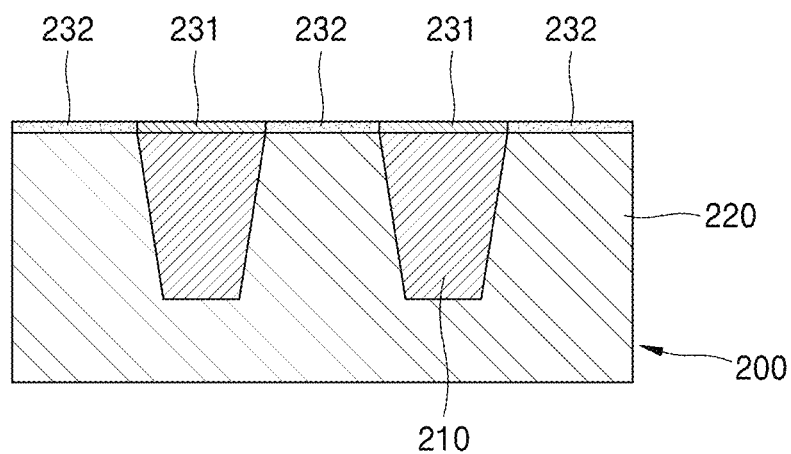

Referring to FIG. 11, surface treatment layers 231 and 232 are formed on a surface of the substrate 200 illustrated in FIG. 9. The surface treatment layers 231 and 232 may be used to adjust a difference in surface energy between the first insulating layer 220 and the first metal layer 210 to allow a carbon layer 240, which will be described later, to be selectively formed only on the first metal layer 210 of the substrate 100. The surface treatment layers 231 and 232 may include a hydrophobic surface treatment layer 231 formed on the first metal layer 210 and a hydrophilic surface treatment layer 232 formed on the first insulating layer 220.

The hydrophobic surface treatment layer 231 may be formed on a surface of the first metal layer 210 as an SAM, and may have a thickness of about several nm. The hydrophobic surface treatment layer 231 may include an organic material including a hydrophobic functional group. For example, the hydrophobic functional group may include, for example, a fluorine group, a methyl group, or a fluorinated alkyl group, but is not limited thereto.

The hydrophilic surface treatment layer 232 may be formed on a surface of the first insulating layer 220 as an SAM, and may have a thickness of about several nm. The hydrophilic surface treatment layer 232 may include an organic material including a hydrophilic functional group. The hydrophilic functional group may include a functional group capable of forming a hydrogen bond. For example, the hydrophilic functional group may include a hydroxyl group, a thiol group, or an amino group, but is not limited thereto.

As the hydrophobic surface treatment layer 231 is formed on the first metal layer 210, and the hydrophilic surface treatment layer 232 is formed on the first insulating layer 220, a difference in surface energy between the first metal layer 210, on which the hydrophobic surface treatment layer 231 is formed, and the first insulating layer 220, on which the hydrophilic surface treatment layer 232 is formed, may be increased.

A difference in contact angles between the first metal layer 210, on which the hydrophobic surface treatment layer 231 is formed, and the first insulating layer 220, on which the hydrophilic surface treatment layer 232 is formed, may be, for example, about 50 degrees or greater, but is not limited thereto.

While an embodiment in which the hydrophobic surface treatment layer 231 is formed on the first metal layer 210 and the hydrophilic surface treatment layer 232 is formed on the first insulating layer 220 is described above, the hydrophobic surface treatment layer 231 may be formed only on the first metal layer 210 and no surface treatment layer may be formed on the first insulating layer 220 or the hydrophilic surface treatment layer 232 may be formed only on the first insulating layer 220 and no surface treatment layer may be formed on the first metal layer 210.

Figure 12:
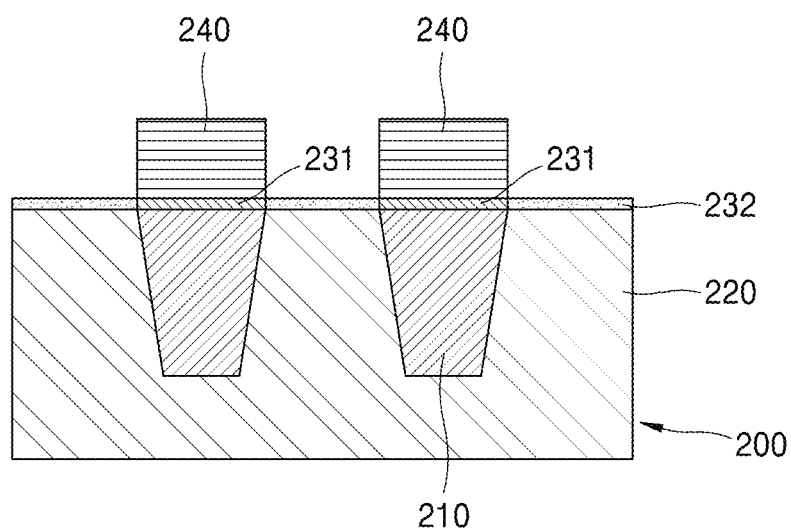

Referring to FIG. 12, the carbon layer 240 is formed on each of the first metal layers 210, on which the hydrophobic surface treatment layer 231 is formed. The carbon layer 240 includes carbon atoms having an $sp^2$ bonding structure. The carbon layer 240 having an $sp^2$ bonding structure is hydrophobic. Accordingly, the carbon layer 240 having an $sp^2$ bonding structure may be selectively formed only on the first metal layer 210, on which the hydrophobic surface treatment layer 231 is formed, in the substrate 200.

The carbon layer 240 having an $sp^2$ bonding structure may include, for example, intrinsic graphene, nanocrystalline graphene, or GQDs. Intrinsic graphene may include crystals having a size greater than about 100 nm, and nanocrystalline graphene may include crystals having a size equal to or smaller than about 100 nm. Also, GQDs refer to nano-sized graphene fragments, and each graphene fragment may have a disc shape having a thickness of about several nm or less and a diameter of about several to tens of nm.

The carbon layer 240 having an $sp^2$ bonding structure may be selectively formed on the first metal layers 210, on which the hydrophobic surface treatment layer 231 is formed, by deposition transfer, or solution coating. When the carbon layer 240 includes graphene, the carbon layer 240 may be formed on the first metal layers 210, on which the hydrophobic surface treatment layer 231 is formed, by deposition such as CVD or PECVD or transfer. Also, when the carbon layer 240 includes GQDs, the carbon layer 240 may be formed by solution coating.

The carbon layer 240 having an $sp^2$ bonding structure has a greater contact angle than the first insulating layer 220 or the first metal layer 210. This indicates that the carbon layer 240 having an $sp^2$ bonding structure has a stable surface having lower surface energy than the first insulating layer 220 or the first metal layer 210. For example, a surface of the carbon layer 240 having an $sp^2$ bonding structure may have a relatively large contact angle of about 60 degrees to about 110 degrees, but is not limited thereto.

According to a result of an experiment regarding contact angles, a contact angle of an IMD was measured to be about 34.8 degrees, and contact angles of Cu and Ru were measured to be about 36.7 degrees and about 29.2 degrees, respectively. In comparison to this, a contact angle of nanocrystalline graphene was measured to be about 90.6 degrees.

As described above, the carbon layer 240 having an $sp^2$ bonding structure and formed on the hydrophobic surface treatment layer 231 has a stable surface having low surface energy, and thus, the carbon layer 240 may act as a mask in a process to be described later, and accordingly, a second insulating layer 250 (FIG. 12) may be selectively formed only on the first insulating layer 220 between the carbon layers 240.

Meanwhile, the carbon layer 240 having an $sp^2$ bonding structure may further include atoms having high electronegativity to further reduce surface energy. For example, the carbon layer 240 may further include F, Cl, Br, N, P or O atoms. In this case, the carbon layer 240 may have a higher contact angle than when the above-described atoms are not added. For example, a contact angle of nanocrystalline graphene including F atoms was measured to be about 102.1 degrees.

After the carbon layer 240 having an $sp^2$ bonding structure is selectively formed on the first metal layers 210, on which the hydrophobic surface treatment layer 231 is formed, the hydrophilic surface treatment layer 232 formed on the first insulating layer 220 may be removed by annealing or the like. In this process, at least a portion of the hydrophobic surface treatment layer 231 formed between the first metal layer 210 and the carbon layer 240 may be degraded.

Figure 13:
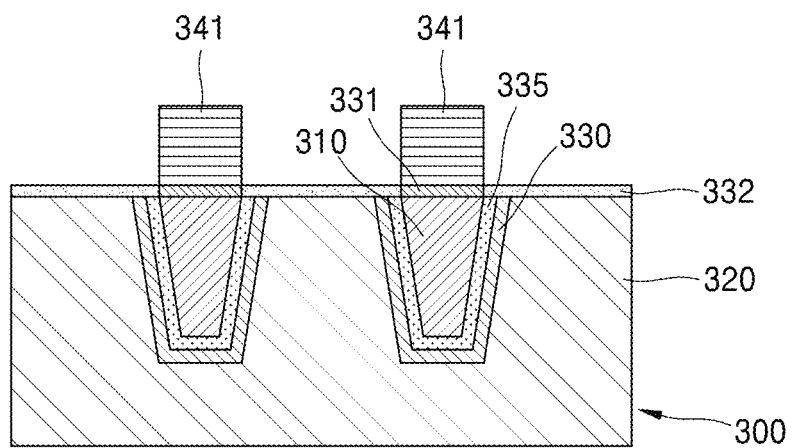
Figure 14:
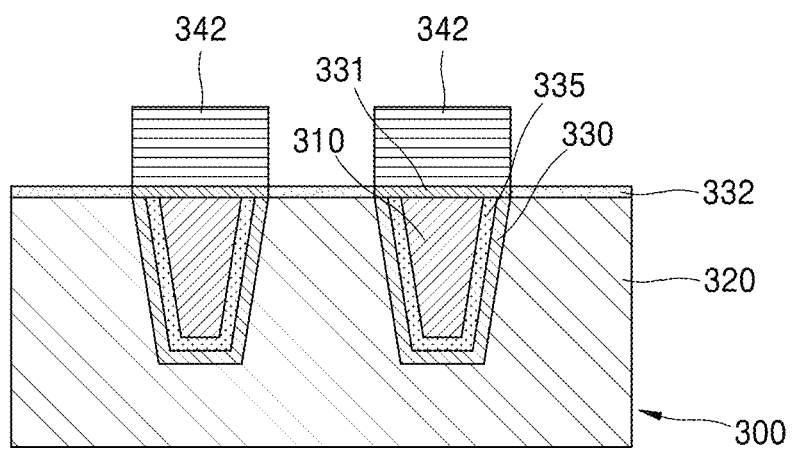

In FIGS. 13 and 14, carbon layers 341 and 342 having an $sp^2$ bonding structure are selectively formed on the substrate 300 illustrated in FIG. 10.

Referring to FIG. 13, the carbon layer 341 having an $sp^2$ bonding structure may be formed to cover only the first metal layer 310 of the substrate 300. In this case, a hydrophobic surface treatment layer 331 may be formed on a surface of the first metal layer 310, and a hydrophilic surface treatment layer 332 may be formed on surfaces of the first insulating layer 320, the barrier layer 330, and the liner layer 335.

Referring to FIG. 14, the carbon layer 342 having an $sp^2$ bonding structure may be formed to cover the first metal layer 310 and the barrier layer 330 of the substrate 300. In this case, the hydrophobic surface treatment layer 331 may be formed on surfaces of the first metal layer 310, the liner layer 335, and the barrier layer 330, and the hydrophilic surface treatment layer 332 may be formed on a surface of the first insulating layer 320.

Figure 15:
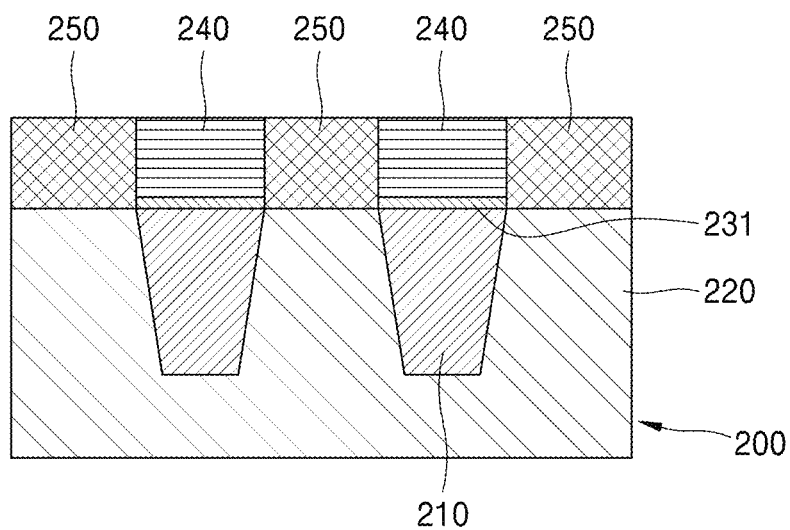

Referring to FIG. 15, the second insulating layer 250 may be selectively formed on the first insulating layer 220 from which the hydrophilic surface treatment layer 232 is removed. The second insulating layer 250 may be deposited on the first insulating layer 220 by atomic layer deposition (ALD), CVD, or the like.

As described above, the carbon layer 240 having an $sp^2$ bonding structure and formed on the first metal layer 210 has a stable surface having lower surface energy compared to the first insulating layer 220, and thus, the carbon layer 240 may act as a mask in a deposition process of the second insulating layer 250. Accordingly, the second insulating layer 250 may be selectively deposited only on the first insulating layer 220 between the carbon layers 240. In addition, the carbon layer 240 having an $sp^2$ bonding structure is thermally stable even at a high temperature of about 400° C. to about 500° C., and thus, the carbon layer 240 may stably serve as a mask in ALD or CVD performed at a high temperature.

As described above, the first insulating layer 220 may include, for example, a low-k dielectric material, whereas the second insulating layer 250 may include a dielectric material having various dielectric constants. For example, the second insulating layer 250 may include $Al_2O_3$, AlN, $ZrO_2$, $HfO_x$, $SiO_2$, SiCO, SiCN, SiON, SiCOH, AlSiO, or BN, is not limited thereto.

Figure 16:
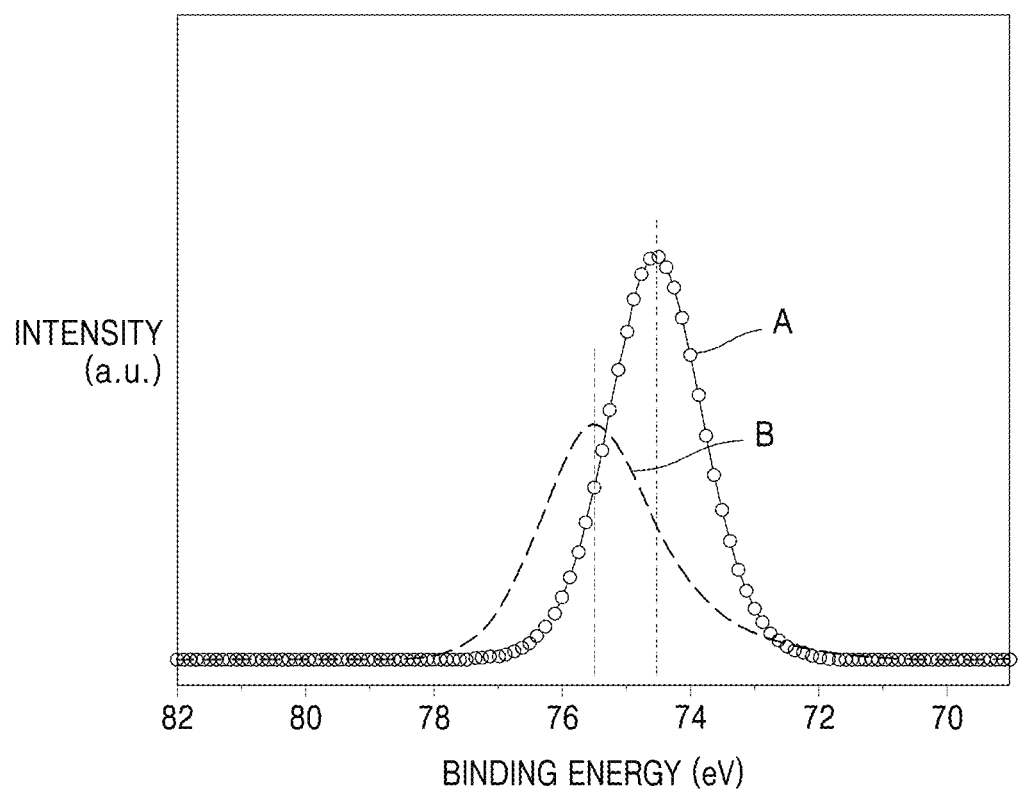

FIG. 16 illustrates an example of a result of measuring an Al2p peak emitted from a substrate including an IMD and nanocrystalline graphene by using XPS, wherein an $Al_2O_3$ thin film is deposited on the substrate by using ALD.

In FIG. 16, "A" denotes Al2p peaks emitted from the IMD, and "B" denotes Al2p peaks emitted from the nanocrystalline graphene. Referring to FIG. 16, a rate at which an $Al_2O_3$ thin film is deposited on the nanocrystalline graphene was measured to be about 22.5% of a rate at which an $Al_2O_3$ thin film is deposited on the IMD. This indicates that an $Al_2O_3$ thin film may be selectively deposited on the IMD instead of the nanocrystalline graphene.

Figure 17:
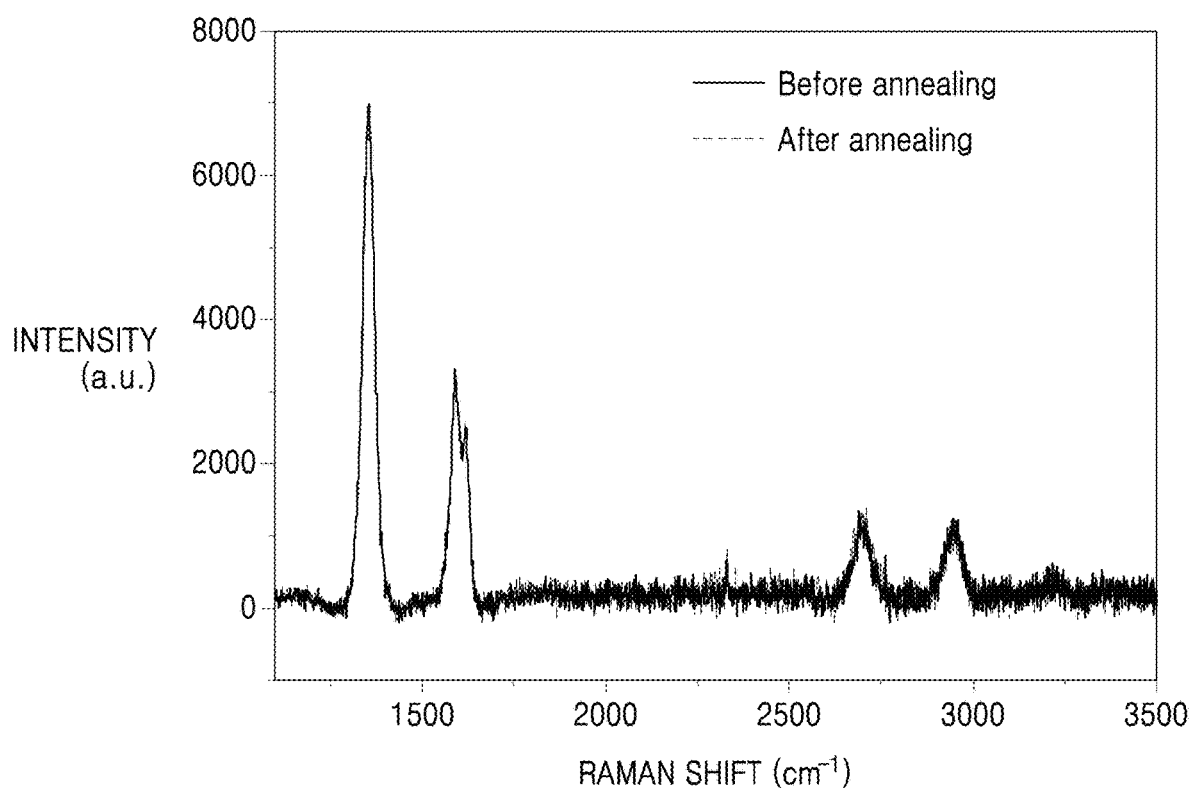

FIG. 17 illustrates an example of a Raman spectrum of nanocrystalline graphene, measured before and after annealing performed during ALD, when an $Al_2O_3$ thin film is deposited, by using ALD, on a substrate including an IMD and nanocrystalline graphene.

Referring to FIG. 17, almost the same Raman spectrum was measured before and after annealing. The result of the experiment above indicates that a carbon layer having an $sp^2$ bonding structure may act as a mask while being hardly affected by annealing performed in a process of depositing a second insulating layer.

Figure 18:
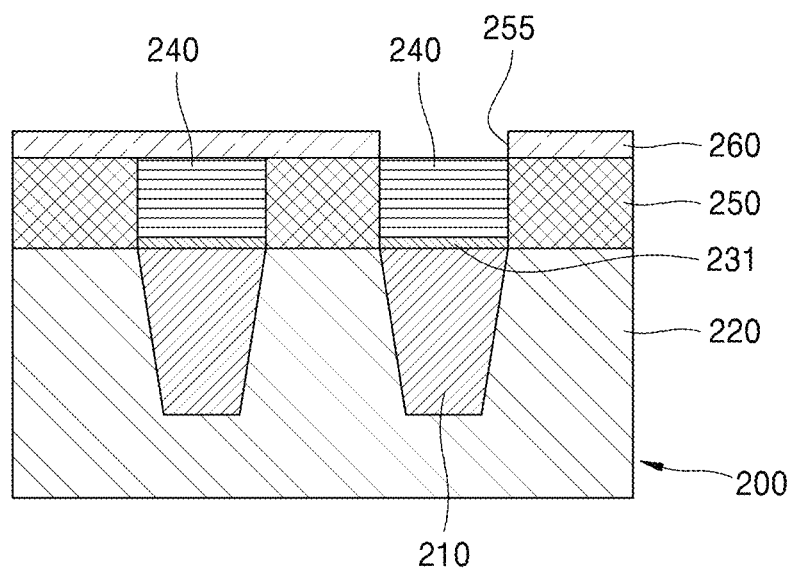

Referring to FIG. 18, after forming a third insulating layer 260 covering the second insulating layer 250 and the carbon layer 240 having an $sp^2$ bonding structure, the third insulating layer 260 is patterned to form a via hole 255 to expose the carbon layer 240. The third insulating layer 260 may be an IMD.

Figure 19:
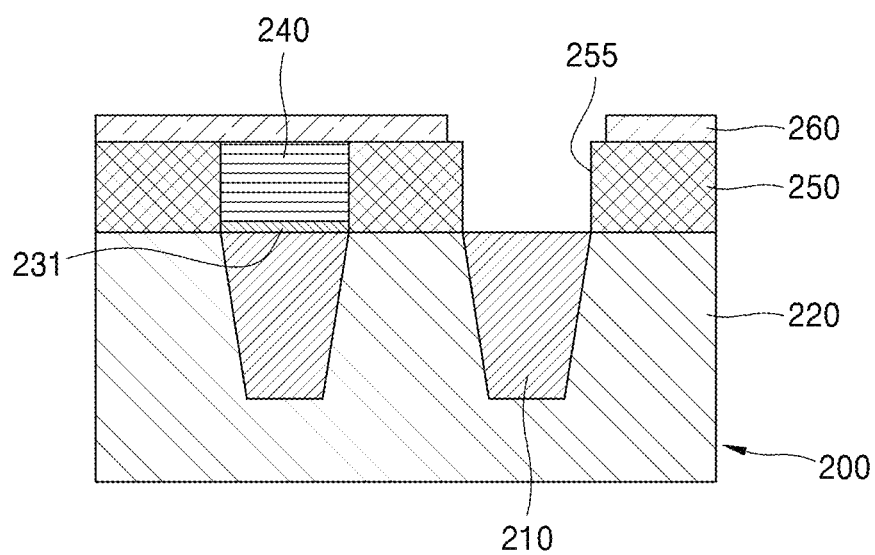

Referring to FIG. 19, the carbon layer 240 exposed through the via hole 255 may be removed. Removal of the carbon layer 240 may be performed by etching or ashing. For example, the carbon layer 240 may be removed using oxygen ($O_2$) plasma) or hydrogen ($H_2$) plasma). When the carbon layer 240 having an $sp^2$ bonding structure is completely removed, the first metal layer 210 of the substrate 200 may be exposed through the via hole 255.

In FIG. 19, an embodiment in which the carbon layer 240 having an $sp^2$ bonding structure and formed on the first metal layer 210 is completely removed is described. However, in other embodiments, the carbon layer 240 formed on the first metal layer 210 may not be removed, and may remain on the first metal layer 210.

Figure 20:
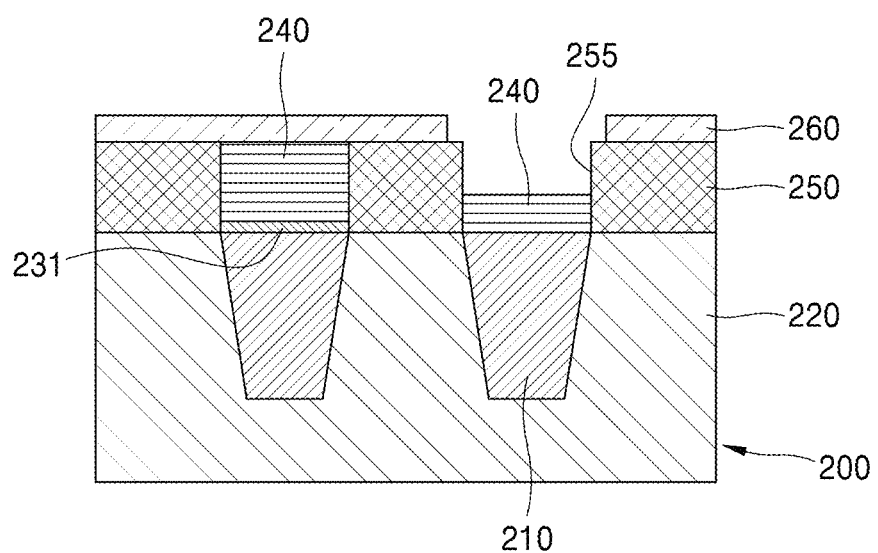

In addition, as illustrated in FIG. 20, only a portion of the carbon layer 240 having an $sp^2$ bonding structure and formed on some of the first metal layers 210 may be removed. The carbon layer 240 having an $sp^2$ bonding structure and remaining on the first metal layer 210 may act as a capping layer in an interconnect structure. The capping layer described above may reduce electrical resistance of the first metal layer 210, thus increasing electromigration resistance.

Recently, for high level of integration of semiconductor devices, the size of semiconductor devices has been gradually decreasing, and accordingly, a line width of conductive wirings is also reduced. However, when the line width of conductive wirings is reduced, a current density in the conductive wirings is increased, thereby increasing electrical resistance of the conductive wirings. The increase in electrical resistance leads to electromigration to cause a defect in the conductive wirings, and this may damage the conductive wirings. Here, the electromigration refers to movement of a substance by continuous movement of ions in a conductor, wherein the movement of ions is generated by the transfer of momentum between conductive electrons and atomic nuclei in a metal.

As described above, by leaving all or a portion of the carbon layer 240 having an $sp^2$ bonding structure and formed on the first metal layer 210, instead of removing the same, the carbon layer 240 left may act as a capping layer that is capable of increasing electromigration resistance.

Figure 21:
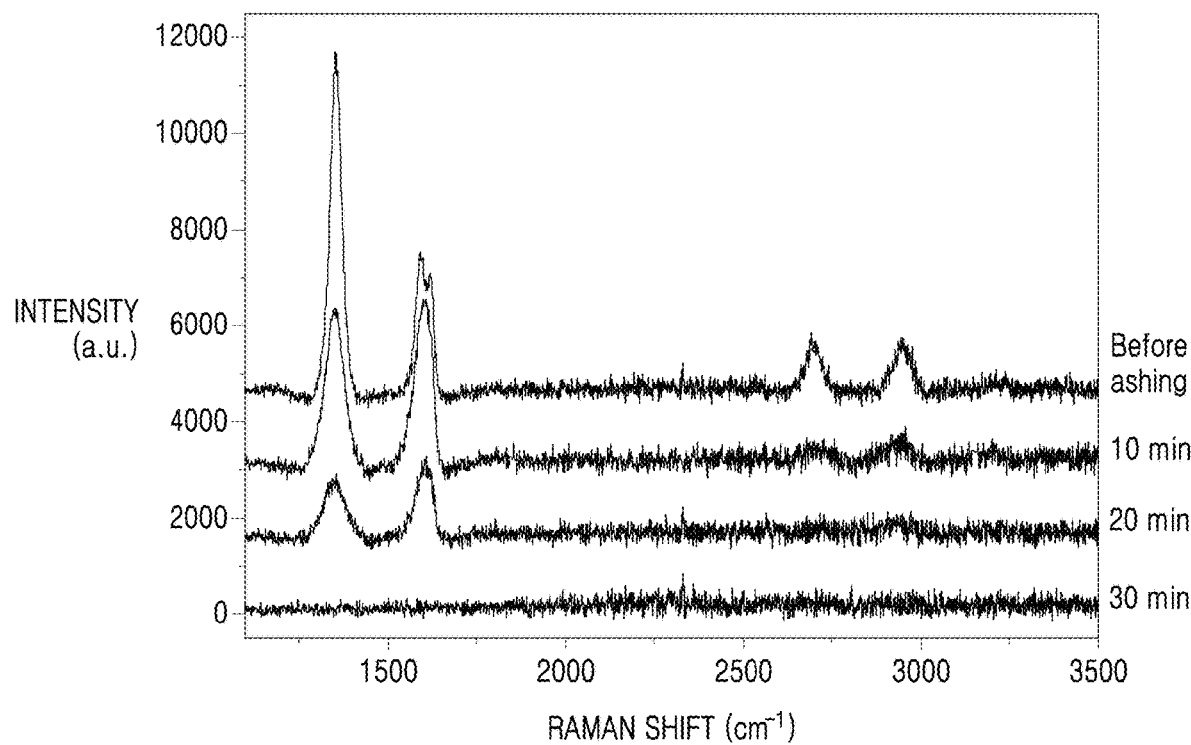

FIG. 21 is an example of a Raman spectrum showing a result of performing an ashing process on nanocrystalline graphene formed on a substrate, by using hydrogen plasma. In FIG. 21, Raman spectrums before performing an ashing process and after performing an ashing process for 10 minutes, 20 minutes, and 30 minutes, respectively, are shown.

Referring to FIG. 21, the longer a hydrogen plasma process is performed, an amount of nanocrystalline graphene formed on the substrate gradually decreases. Accordingly, by adjusting a period of time of performing the hydrogen plasma process, an amount of nanocrystalline graphene left on the substrate may be adjusted.

Figure 22:
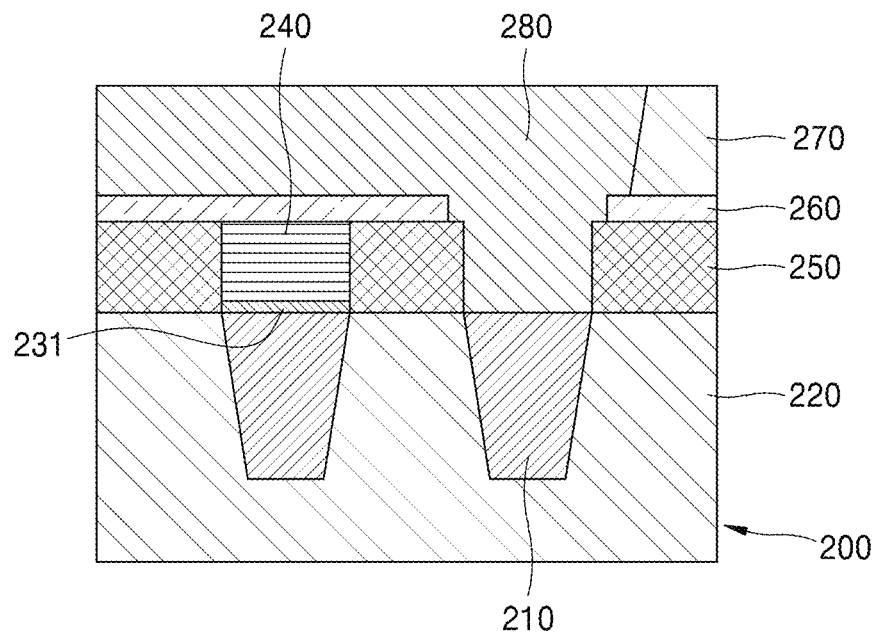

Referring to FIG. 22, a fourth insulating layer 270 is formed to fill the via hole 255, and then the fourth insulating layer 270 is patterned to form a second metal layer 280 that is electrically connected to the first metal layer 210. The fourth insulating layer 270 may be an IMD.

Figure 23:
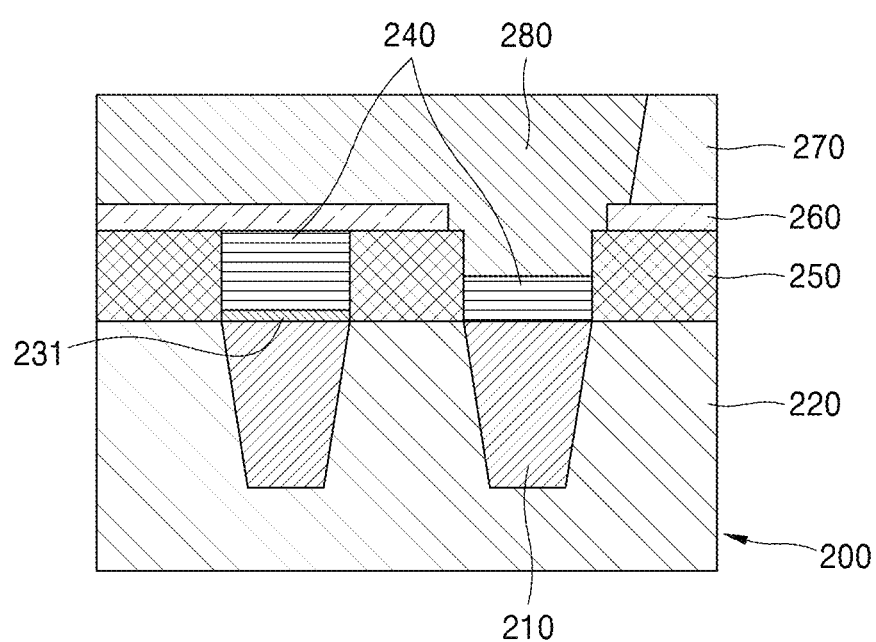
FIGS. 23, 24A, and 24B are interconnect structures according to some embodiments.

When at least a portion of the carbon layer 240 formed on the first metal layer 210 is not removed but left, there may be the carbon layer 240 between the first metal layer 210 and the second metal layer 280, as depicted in FIG. 23.

Above, an embodiment in which the third insulating layer 260 is formed to cover the carbon layer 240 and the second insulating layer 250 and then the carbon layer 240 exposed through the via hole 255 formed by patterning the third insulating layer 260 is removed is described. However, alternatively, the carbon layers 240 may be removed while in the state as illustrated in FIG. 15, and then the third insulating layer 260 may be formed and patterned to form a via hole exposing the first metal layer 210.

As described above, when forming an interconnect structure by using an FAV integration process, by forming the surface treatment layers 231 and 232, through which surface energy may be adjusted, on a surface of the substrate 200 including the first metal layer 210 and the first insulating layer 220, the carbon layer 240 having an $sp^2$ bonding structure may be selectively formed only on the first metal layer 210. Also, by using the carbon layer 240 as a mask in a deposition process of the second insulating layer 250, the second insulating layer 250 may be selectively deposited only on the first insulating layer 220 between the carbon layers 240.

FIGS. 15, 18-20, and 22 illustrate an example where operations of the method of forming an interconnect structure are applied to the substrate 200 in FIGS. 9-12, but example embodiments are not limited thereto. One of ordinary skill in the art would appreciate that the operations in FIGS. 15, 18-20, and 22 alternatively may be applied to the substrate 300 including the carbon layer 341 or the carbon layer 342 in FIG. 13 or FIG. 14, respectively.

Figure 24A:
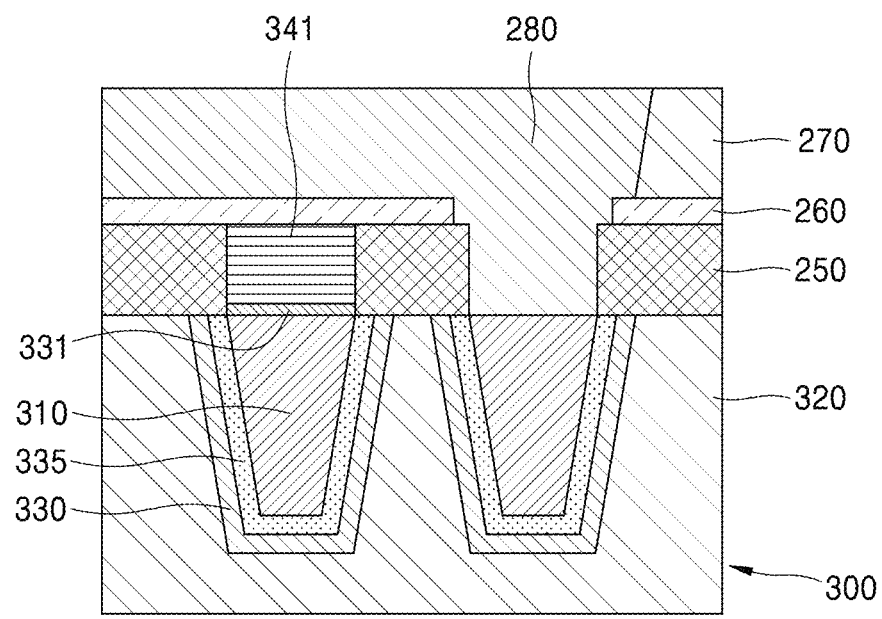

For example, referring to FIGS. 13 and 24A, an interconnect structure according to an embodiment may be formed by selectively forming a second insulating layer 250 only on the first insulating layer 320, barrier layer 330, and liner layer 335 after the hydrophilic surface treatment layer 332 is removed. Then, the third insulating layer 260 covering the second insulating layer 250 may be formed and patterned to provide a via hole like the via hole 255 shown in FIG. 18. Then, a fourth insulating layer 270 and second metal layer 280 may be formed on the third insulating layer 260, second insulating layer 250, and carbon layer 341. The second metal layer 280 may be electrically connected to the first metal layer 210 through the via hole. Alternatively, although not shown, a portion of the carbon layer 341 may remain between the second metal layer 280 and first metal layer 210.

Figure 24B:
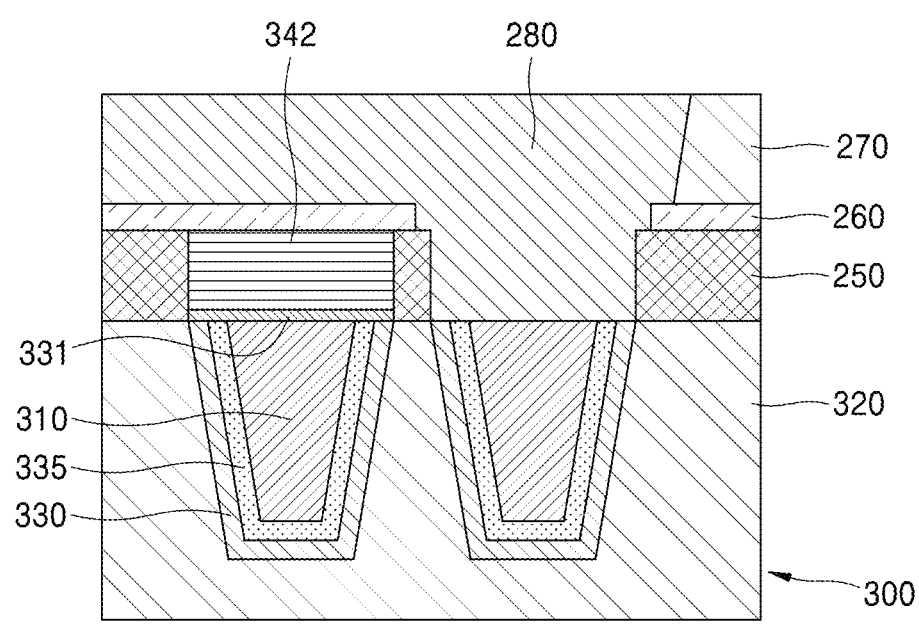

Additionally, for example, referring to FIGS. 13 and 24B, an interconnect structure according to an embodiment may be formed by selectively forming a second insulating layer 250 only on the first insulating layer 320 after the hydrophilic surface treatment layer 332 is removed. Then, the third insulating layer 260 covering the second insulating layer 250 may be formed and patterned to provide a via hole like the via hole 255 shown in FIG. 18. Then, a fourth insulating layer 270 and metal layer 280 may be formed on the third insulating layer 260, second insulating layer 250, and carbon layer 342. The metal layer 280 may be electrically connected to the first metal layer 210. Alternatively, although not shown, a portion of the carbon layer 343 may remain between the metal layer 280 and first metal layer 210.

As described above, according to example embodiments, by forming a surface treatment layer through which surface energy may be adjusted, on a surface of a substrate including first and second material layers having different characteristics, a carbon layer having an $sp^2$ bonding structure and a stable surface having low surface energy may be selectively formed on only one of the first and second material layers.

According to other embodiments, when forming an interconnect structure by using an FAV integration process, by forming a surface treatment layer through which surface energy may be adjusted, on a surface of a substrate including a first metal layer and a first insulating layer, a carbon layer having an $sp^2$ bonding structure may be selectively formed only on the first metal layer. Also, by using the carbon layer as a mask in a deposition process of a second insulating layer, the second insulating layer may be selectively deposited only on the first insulating layer between the carbon layers.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A method of forming a carbon layer, the method comprising:
providing a substrate including a first material layer and a second material layer;
forming a surface treatment layer on at least one of the first material layer and the second material layer; and
selectively forming a carbon layer on a portion of the surface treatment layer on the at least one of the first material layer and the second material layer, the carbon layer having an $sp^2$ bonding structure.

2. The method of claim 1, wherein
the surface treatment layer forms a hydrophobic surface on the first material layer and a hydrophilic surface on the second material layer, and
the selectively forming the carbon layer forms the carbon layer over the hydrophobic surface on the first material layer.

3. The method of claim 1, wherein the carbon layer comprises intrinsic graphene, nanocrystalline graphene, or graphene quantum dots (GQDs).

4. The method of claim 1, wherein the forming the surface treatment layer includes forming the surface treatment layer as a self-assembled monolayer (SAM).

5. The method of claim 1, wherein, after the forming the surface treatment layer, a difference between a water contact angle (WCA) of the first material layer and a WCA of the second material layer is 50 degrees or greater.

6. The method of claim 1, wherein the forming the surface treatment layer comprises at least one of:
forming a hydrophobic surface treatment layer on one of the first material layer or the second material layer; and
forming a hydrophilic surface treatment layer on an other of the first material layer or the second material layer.

7. The method of claim 6, wherein the hydrophobic surface treatment layer comprises an organic material including a hydrophobic functional group.

8. The method of claim 6, wherein the hydrophilic surface treatment layer comprises an organic material including a hydrophilic functional group.

9. The method of claim 8, wherein the hydrophilic functional group comprises a functional group capable of forming a hydrogen bond.

10. The method of claim 1, wherein
the first material layer comprises a metal, and
the second material layer comprises an insulator or a semiconductor.

11. The method of claim 1, wherein the selectively forming the carbon layer is performed using deposition, transfer, or solution coating.

12. The method of claim 1, further comprising:
selectively forming a third material layer on the first material layer or the second material layer, wherein
the third material layer is formed on the one of the first material layer and the second material layer on which the carbon layer is not formed.

13. The method of claim 1, wherein
the first material layer comprises an insulator or a semiconductor, and,
the second material layer comprises a metal.

14. A method of forming an interconnect structure, the method comprising:
providing a substrate including a first metal layer and a first insulating layer;
forming a surface treatment layer on at least one of the first metal layer and the first insulating layer; and
selectively forming a carbon layer on the first metal layer, the carbon layer having an $sp^2$ bonding structure;
selectively forming a second insulating layer on the first insulating layer;
forming a third insulating layer to cover the second insulating layer; and
forming a second metal layer after the forming the third insulating layer, the second metal layer being electrically connected to the first metal layer.

15. The method of claim 14, wherein the carbon layer comprises intrinsic graphene, nanocrystalline graphene, or graphene quantum dots (GQDs).

16. The method of claim 14, wherein the first insulating layer comprises a dielectric material having a dielectric constant of 3.6 or lower.

17. The method of claim 14, wherein the carbon layer has a contact angle of about 60 degrees to about 110 degrees.

18. The method of claim 14, wherein the carbon layer further comprises F, CL, Br, N, P or O atoms.

19. The method of claim 14, wherein the second insulating layer comprises $Al_2O_3$, AlN, $ZrO_2$, $HfO_x$, $SiO_2$, SiCO, SiCN, SiON, SiCOH, AlSiO, or BN.

20. The method of claim 14, wherein at least a portion of the carbon layer remains on the first metal layer after the forming the second metal layer.

21. The method of claim 14, further comprising:
removing a portion of the carbon layer or removing all of the carbon layer.

22. A method of forming a carbon layer, the method comprising:
forming a surface treatment layer on a substrate, the substrate including a first material layer and a second material layer, a material of the first material layer being different than a material of the second material layer, the surface treatment layer on the first material layer; and
selectively forming a carbon layer on the surface treatment layer on the first material layer and not the second material layer, the carbon layer having an $sp^2$ bonding structure.

23. The method of claim 22, wherein the carbon layer comprises intrinsic graphene, nanocrystalline graphene, or graphene quantum dots (GQDs).

24. The method of claim 22, wherein the forming the surface treatment layer comprises at least one of:
forming a hydrophobic surface treatment layer on the first material layer; and
forming a hydrophilic surface treatment layer on the second material layer.

25. The method of claim 22, wherein
the first material layer comprises a metal, and
the second material layer comprises an insulator or a semiconductor.

* * * * *